United States Patent
Ortiz et al.

(10) Patent No.: US 6,675,362 B1
(45) Date of Patent: Jan. 6, 2004

(54) METHOD AND APPARATUS FOR MANAGING CIRCUIT TESTS

(75) Inventors: Richard D. Ortiz, Roseville, CA (US); John P. Huetter, Auburn, CA (US); Gale A. Sill, Roseville, CA (US); Duong Xuan Vu, Antelope, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 616 days.

(21) Appl. No.: 09/592,033

(22) Filed: Jun. 12, 2000

(51) Int. Cl.[7] .............................................. G06F 17/50
(52) U.S. Cl. ............................................... 716/4; 716/1
(58) Field of Search ........................... 716/4, 1–3, 5–10

(56) References Cited

U.S. PATENT DOCUMENTS

| | | | | |
|---|---|---|---|---|
| 5,444,390 A | * | 8/1995 | Bartlett et al. | 324/770 |
| 5,481,471 A | * | 1/1996 | Naglestad et al. | 716/4 |
| 5,710,934 A | * | 1/1998 | Bona et al. | 714/724 |
| 5,726,920 A | * | 3/1998 | Chen et al. | 702/108 |
| 5,922,079 A | * | 7/1999 | Booth et al. | 714/26 |
| 5,946,482 A | * | 8/1999 | Barford et al. | 703/14 |
| 5,977,775 A | * | 11/1999 | Chandler et al. | 324/537 |
| 6,038,520 A | * | 3/2000 | Schoonover et al. | 702/117 |
| 6,083,271 A | * | 7/2000 | Morgan | 716/1 |
| 6,308,300 B1 | * | 10/2001 | Bushnell et al. | 716/4 |
| 6,334,100 B1 | * | 12/2001 | Ahrikencheikh et al. | 703/14 |
| 6,363,509 B1 | * | 3/2002 | Parulkar et al. | 714/738 |
| 2002/0072872 A1 | * | 6/2002 | Chatterjee et al. | 702/117 |

* cited by examiner

Primary Examiner—Matthew Smith
Assistant Examiner—Magid Y Dimyan

(57) ABSTRACT

Methods and apparatus for managing circuit tests. In a first embodiment of the invention, a number of electrical characteristics of a number of electrical components which exist in a circuit are identified, and the number of electrical components are then grouped in response to the number of electrical characteristics. Thereafter, and for each group of electrical components, a circuit test which is common to the electrical components of the group is established. When the execution of a test results in a false fail, the test is debugged, and the debugged test is then associated with each other component in its group. Much of a programmer's debug effort is therefore "proactive" rather than "reactive". Preferably, a test history log is maintained for each component group so that previously abandoned test solutions are not repeated as tests are debugged. In a second embodiment of the invention, a number of test parameters of a number of circuit tests created for a number of electrical components which exist in a circuit are identified. Circuit components are then grouped in response to the test parameters rather than in response to electrical characteristics (though some of the test parameters may actually be electrical characteristics). The methods are preferably implemented in software. The methods and apparatus disclosed not only shorten the time required to complete a debug effort (i.e., to insure that tests are stabile), but also insure a greater degree of uniformity among tests which are associated with like electrical components.

26 Claims, 8 Drawing Sheets

602
•
•
• c806
    capacitor 1.010u, 8.77, 17.6, fr128, re2, ar50.0m, ed, nocomp
r579
    resistor 1k, 5.93, 4.96, re3, wb, ar100m
e2
    inductor 111u, 33.8, 33.8, fr8192, re1, ar200m
c828
    capacitor 1.010u, 8.77, 17.6, fr128, re2, ar50.0m, ed, nocomp
c794
    capacitor 1.010u, 8.77, 17.6, fr128, re2, ar50.0m, ed, nocomp
r95
    resistor 1k, 5.93, 4.96, re3, wb, ar100m

```
capacitor  1.010u,  8.77,17.6,  fr128,  re2,  ar50.0m,  ed,  nocomp
└────┘   └────┘  └┘ └┘   └──┘  └─┘  └────┘  └┘ └────┘
 700      702   704 706   708   710   712   714   716
```
FIG. 7A

```
inductor  111u,  33.8,  33.8,   fr8192,  re1,  ar200m
└────┘   └──┘  └─┘   └─┘    └────┘   └─┘  └────┘
 718     720   722   724    726    728   730
```
FIG. 7B

```
resistor  1k,   5.93,   4.96,  re3,  wb,  ar100m
└────┘  └─┘  └──┘   └──┘  └─┘ └┘   └────┘
 732    734   736    738  740 742   744
```
FIG. 7C 800
```
PATH: analog
  KEY: capacitor 1.010u, 8.77, 17.6, fr128, re2, ar50.0m, ed, nocomp
  c773
  c783
  c794
  c806
  c816
  c828
```

802
```
PATH: analog
  KEY: resistor 1k, 5.93, 4.96, re3, wb, ar100m
  r579
  r580
  r581
  r594
  r597
  r598
  r95
```

804
```
PATH: analog
   KEY: inductor 111u, 33.8, 33.8, fr8192, re1, ar200m
   e1
   e2
   e503
```

FIG. 8

```
902 ─┐  capacitor 1.010u, 8.77, 17.6, fr128, re2, ar50.0m, ed, nocomp
     └─ !! Edited on Mon Mar 6 12:35:20 2000
        !! Edit Initiated by test: analog/c806

904 ─┐  !!capacitor 1.010u, 7.77, 17.6, fr128, re2, ar50.0m, ed, nocomp
     └─ !! Edited on Mon Mar 6 16:20:04 2000
        !! Edit Initiated by test: analog/c806

906 ─┐  !!capacitor 1.010u, 5.77, 17.6, fr128, re2, ar50.0m, ed, nocomp
     └─ !! Edited on Thu Mar 9 14:04:17 2000
        !! Edit Initiated by test: analog/c828
```

FIG. 9

METHOD AND APPARATUS FOR MANAGING CIRCUIT TESTS

FIELD OF THE INVENTION

The invention pertains to the development and debug of circuit tests, and particularly, to the development and debug of in-circuit tests which are designed to test the functionality of analog components mounted on a printed circuit board.

BACKGROUND OF THE INVENTION

The development of circuit tests for the purpose of in-circuit testing is a costly and time consuming process. Not only must tests be written (or generated), but thereafter the tests must be debugged.

Circuit tests are typically debugged on a reactive basis. That is, tests are repeatedly executed with respect to one or more circuit boards while waiting for a component to be designated FAILED. When a component is designated FAILED, it must then be determined whether the component has truly failed, or whether execution of a test with respect to the component has led to the generation of a "false fail". A "false fail" is defined herein as a fail which is triggered as a result of a test misadjustment rather than an actual component failure.

If it is determined that the execution of a test with respect to a particular component has led to the generation of a false fail, the test must be debugged so as to prevent a reoccurrence of the false fail. Such a debug effort is a "reactive" debug effort. That is, an in-circuit test (ICT) programmer must 1) wait for a component to be designated FAILED, 2) determine whether the fail is a false fail, and then 3) debug a circuit test if the test is believed to have caused the false fail.

SUMMARY OF THE INVENTION

A problem which is encountered when debugging circuit tests is that tests are not manageable other than on an individual basis. That is, a circuit test is individually developed and maintained for each component in a circuit. As a result, many debug efforts are unnecessarily repeated.

For example, consider a circuit comprising twenty 10 kΩ resistors. Presently, each of these resistors has to be associated with its own unique circuit test, and a debug of the circuit tests associated with the twenty resistors results in twenty different debug efforts. Since the twenty resistors are subject to manufacturing variances, slight variations in the twenty resistors will likely lead to the twenty resistors generating false fails at different times. If an ICT programmer is lucky, "gross" test misadjustments will result in many of the resistors being falsely designated as FAILED at about the same time, and the programmer can make similar test adjustments to the tests associated with all of the resistors. However, in later stages of a debug effort, the resistors are likely to be falsely designated as FAILED at widely varying times, and the programmer will have to adjust the tests associated with each of the resistors in a distinct and remote debug effort. Since there are many test solutions which a programmer can try, he or she is likely to make different adjustments with respect to each of the different resistor tests. It is also quite probable that different programmers will be responsible for making the different test adjustments as the different tests produce false fails.

The inventors propose methods and apparatus for grouping circuit tests to make them more manageable. One advantage of the increased manageability is that duplicate debug efforts such as those discussed in the preceding paragraph can be avoided.

The techniques disclosed herein help to manage circuit tests by first forming component groups, and then establishing for each group a circuit test which is common to the components of the group. When one component of a group is falsely designated as FAILED, the circuit test which is associated with the falsely failed component is debugged, and the debugged circuit test is then used as a template to update the circuit tests associated with other components in the falsely failed component's group. In this manner, circuit tests which are associated with non-failing components are debugged proactively. Proactive debugging not only reduces debug time, but also insures that circuit tests for like components retain a degree of uniformity.

In one embodiment of the invention, a test history log is maintained. The maintenance of a test history log is especially advantageous in that such a log can be used to not only track the test history of a particular component, but to track the test history of all of the components in a particular component group. Thus, if a test solution has already been tried and discarded with respect to one component in the group, an ICT programmer can avoid retrying the faulty test solution with respect to other components in the same group.

With existing techniques for developing and debugging circuit tests, there are no economies of scale. Thus, the time required to develop and debug circuit tests for a particular circuit is more or less a function of the number of components in the circuit. Consider, for example, the following two circuits:

---

Circuit A = 1,000 components
    = 2 days for development and initial debug of tests
      (gross debug)
    = 4 weeks for stabilization of tests (fine debug)
Circuit B = 250 components
    = ½ day for development and initial debug of tests
      (gross debug)
    = 1 week for stabilization of tests (fine debug)

---

Since Circuit B has 75% fewer components than Circuit A, the time required to develop and debug circuit tests for Circuit B is 75% less than the time required to develop and debug circuit tests for Circuit A.

With the techniques disclosed herein, the time required to develop and debug circuit tests is not related to the number of components in a circuit, but rather the number of component groups in a circuit. Component groups may be formed by identifying various electrical characteristics of a number of components which exist in a circuit, and then grouping the components in response to their electrical characteristics. Electrical characteristics may comprise characteristics such as component type, component value, and circuit topology (i.e., the way in which a component is topologically connected within a circuit).

By proactively debugging circuit tests, and avoiding repetition of faulty test solutions, an ICT programmer can achieve stabilization of all of the tests in a test suite much quicker than he or she could achieve same in the past. For example, refer back to Circuits A and B, supra. Although Circuit A has 1,000 components, it might only comprise 100 component groups. If so, the use of the proactive debugging techniques disclosed herein would reduce the time it takes to debug Circuit A to approximately one-tenth of the time it takes to debug Circuit A using current reactive debugging techniques.

The above embodiments of the invention assume that one has access to a mathematical circuit model or the like, from which electrical components and their characteristics may be identified for the purpose of grouping the components. In some cases, this information may not be available. For example, it is possible that one may only have access to an already generated test suite. In this case, electrical components may be grouped based on the test parameters which are found in already existing circuit tests. If the test parameters for two components are identical, then it typically follows that the two components are of the same type, value, and so on. If a test suite is largely generated from test libraries, and is generated in an automated way, then the grouping of a circuit's components by relying on test parameters found in the tests which are associated with the components should yield the same component groups as would be formed when grouping is based directly on the electrical characteristics of a number of components.

These and other important advantages and objectives of the present invention will be further explained in, or will become apparent from, the accompanying description, drawings and claims.

BRIEF DESCRIPTION OF THE DRAWINGS

Illustrative and presently preferred embodiments of the invention are illustrated in the drawings in which:

FIG. 6 illustrates an exemplary portion of a test suite which might be parsed while executing the FIG. 4 method;

FIGS. 7A, 7B & 7C illustrate some of the test parameters which are found in the tests of the FIG. 6 test suite;

FIG. 8 illustrates component groups which might be formed from the FIG. 6 test suite while executing the FIG. 4 method; and FIG. 9 illustrates an exemplary test history log which might be formed when the FIG. 6 test suite is debugged according to the FIG. 3 method.

DESCRIPTION OF THE PREFERRED EMBODIMENT

Figure 1:
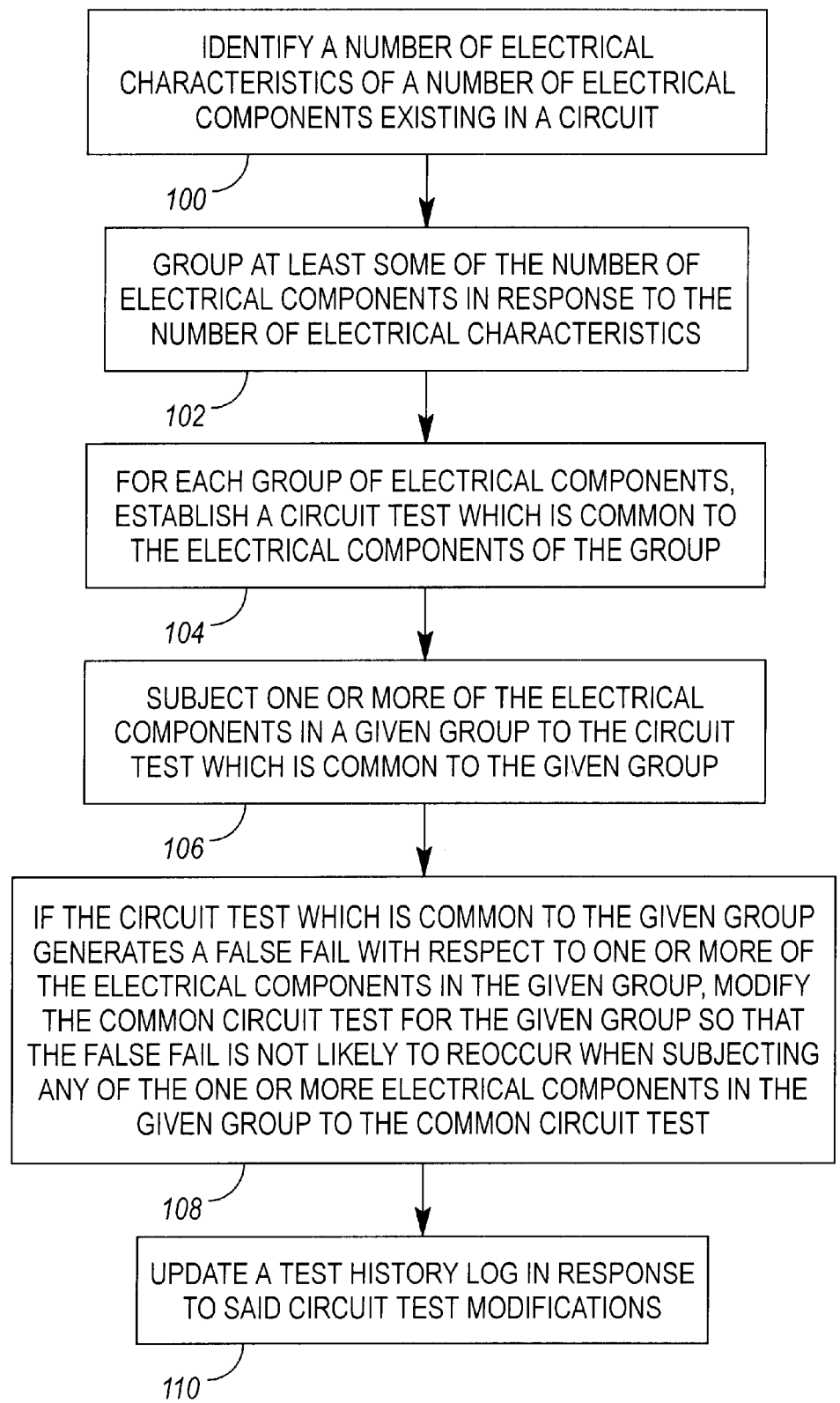
FIG. 1 illustrates a first preferred method of managing circuit tests.
Figure 2:
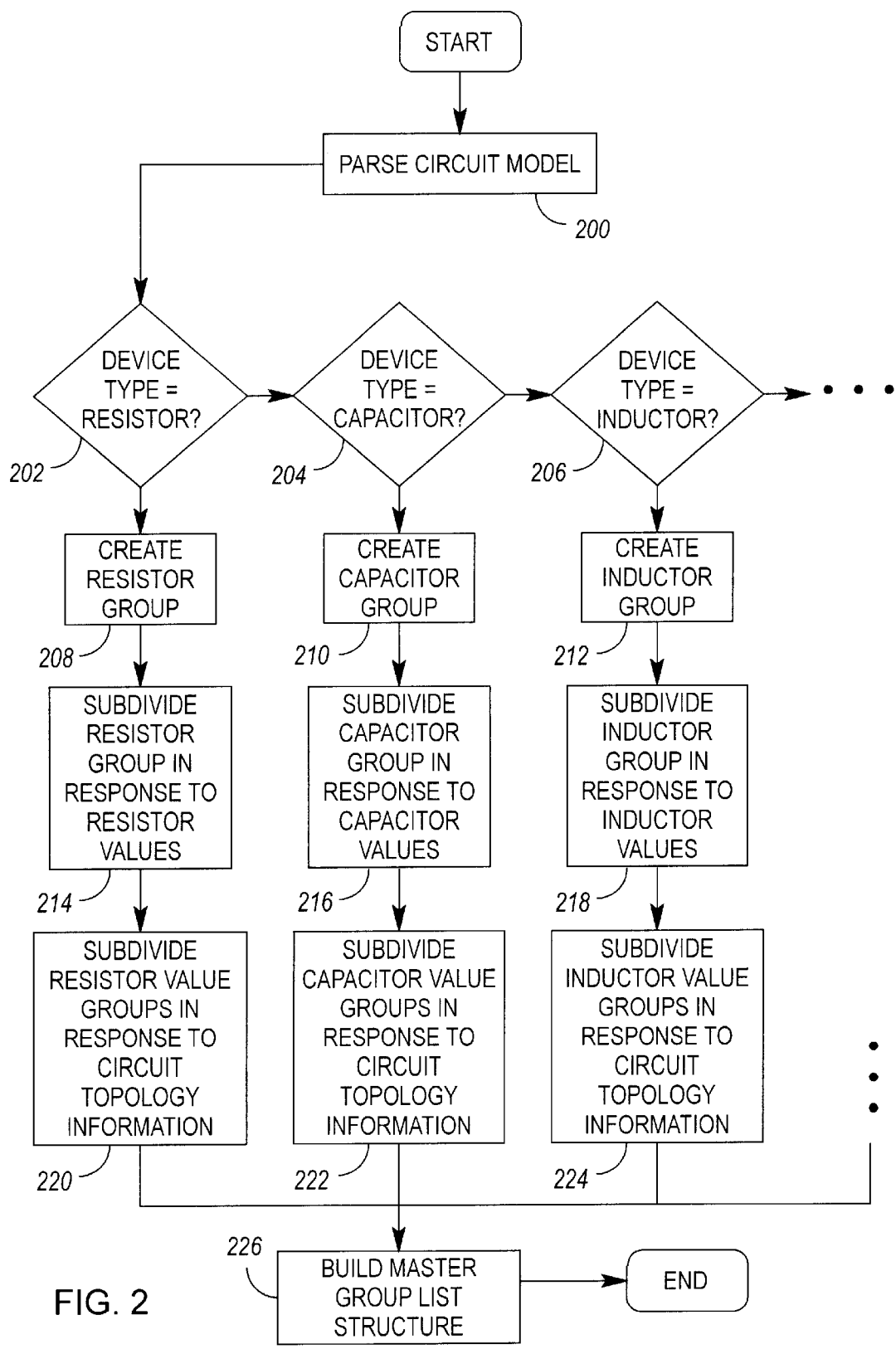
FIG. 2 illustrates a method of forming the electrical component groups which are required by the FIG. 1 method.
Figure 3:
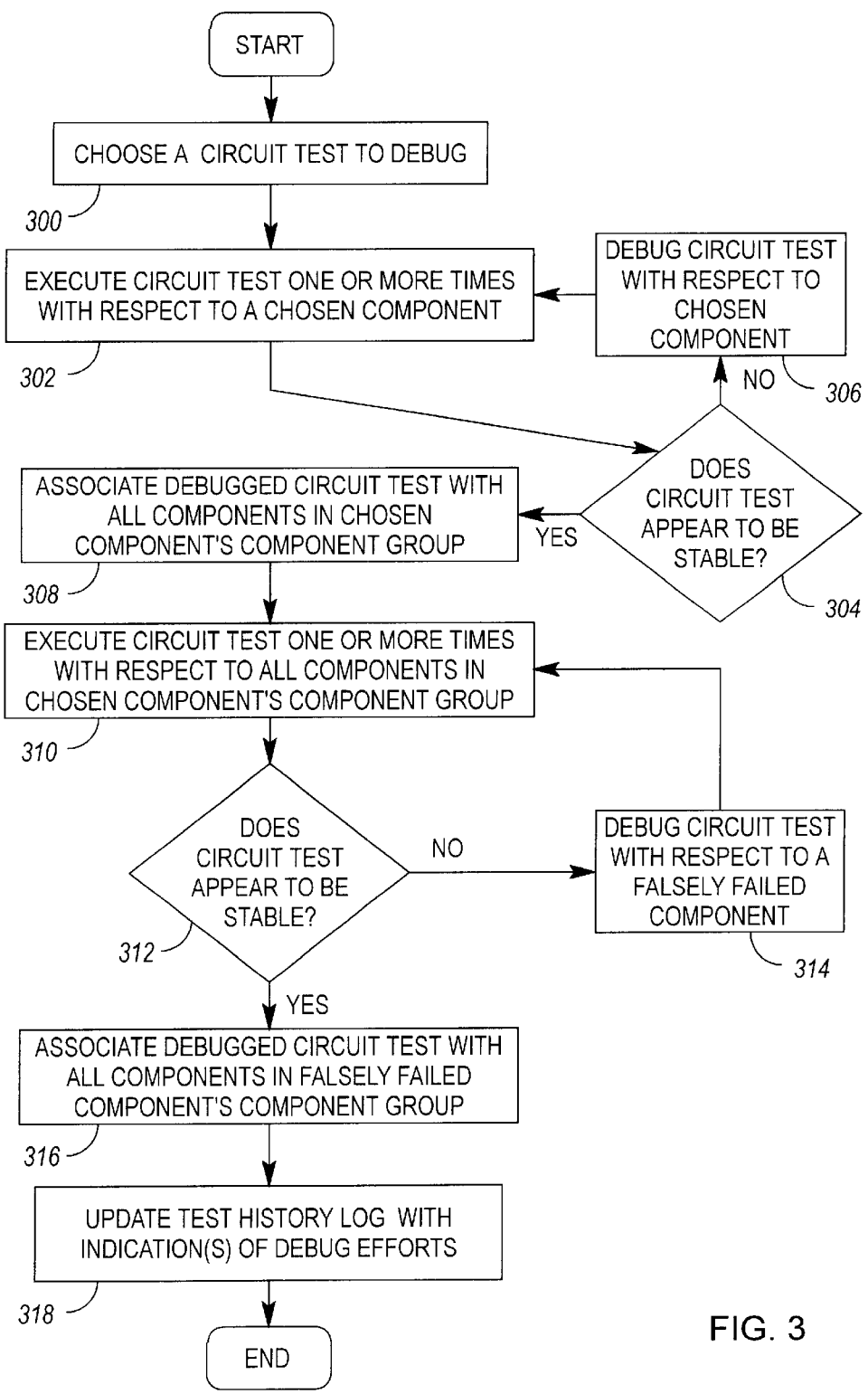
FIG. 3 illustrates a method of debugging circuit tests which are managed by the FIG. 1 method.

In accordance with the invention, a first method of managing circuit tests is illustrated in FIGS. 1–3. The method begins with the identification 100 (FIG. 1) of a number of electrical characteristics of a number of electrical components which exist in a circuit. Such an identification 100 may be performed in a variety of ways. One way to perform such an identification is by parsing 200 (FIG. 2) a computer file containing a mathematical model of the circuit.

The electrical components for which electrical characteristics are identified 100 may comprise analog and/or digital components. However a preferred embodiment of the method only manages circuit tests for analog components such as resistors, capacitors and inductors. The electrical characteristics which are identified 100 for these components may comprise characteristics such as: component type information, component value information, and circuit topology information. Circuit topology information is information which indicates how components are connected within a circuit.

After electrical characteristics of a number of electrical components have been identified 100, at least some of the electrical components are grouped 102 in response to their electrical characteristics. Preferably, all of the electrical components are sorted into groups. However, as will be discussed later in this description, there may be reasons for not grouping 102 some of the electrical components.

FIG. 2 illustrates an exemplary method for performing such a grouping 102. First, the electrical components are grouped by type (e.g., a group of resistors 202, 208, a group of capacitors 204, 210, a group of inductors 206, 212, and a group or groups of other components). Thereafter, the component groups are divided into smaller groups based on component values 214, 216, 218 and circuit topology information 220, 222, 224. Finally, a master group list structure comprising a list of all of the components in each group is compiled 226.

Preferably, groups of components are formed in response to identity of electrical characteristics. Thus, all of the resistors in a resistor pack comprising five 10 kΩ resistors would fall into the same group. However, if a resistor pack had three resistors, and their values were 1 kΩ, 10 kΩ and 100 kΩ, each of the resistors would fall into a different group. Alternatively, groups of components may be formed in response to ranges of electrical characteristics. For example, resistors having a value of between 0.9 kΩ and 1.1 kΩ might be included within the same group. Formation of component groups based on ranges of characteristics might be particularly advantageous when the electrical characteristics of a circuit's components are determined from physical measurements taken from a circuit, rather than from component descriptions which are found in a mathematical model of a circuit. In such a case, physical measurements which are taken from a circuit would likely identify subtle manufacturing variances in the electrical characteristics of theoretically identical components. By defining ranges of electrical characteristics for the purpose of grouping 102, it can sometimes be possible to group components with slightly different electrical characteristics into groups of theoretically identical components.

After components have been grouped, the FIG. 1 method continues by establishing 104, for each component group, a circuit test which is common to the components of the component group. The common circuit test can be the only test for the components of the group, or just one of many tests for the components in the group. If each component in a group is subjected to more than one test, it is preferable that all of the tests for the components of a group be tests which are common to the components of the group.

Although a common circuit test is established 104 for each component group, test equipment typically requires a one-to-one correspondence between electrical components and circuit tests, and components which are not associated with their own unique test will not be tested. As a result, even though the method of FIG. 1 establishes 104 a circuit test which is common to each group of components, the common test will often need to be copied and associated with each component in its corresponding component group. This can be done, for example, by maintaining lists of electrical components which are included in each group of electrical components, and then using the lists as indexes into a data structure which maintains a test suite comprising a number of circuit tests. In this manner, each time a circuit test for one electrical component in a particular group of electrical components is modified, the list of electrical components which are included in the particular group can be used as an index into the data structure which maintains the number of circuit tests, thereby providing "group update" operations such as Replace and Undo.

Once components have been grouped 102, and tests which are common to the components of each group have been established 104, execution 106 and debug 108 of the common tests which have been established for each component group may begin. Debugging 108 is the process of modifying a test so as to avoid the generation of "false fails". A false fail is a designation of a component as FAILED when in fact the component has not failed. A false fail is generated as a result of a test misadjustment (e.g., the test is faulty, or more stringent than is needed for a given application).

A circuit test which is common to a component group may be debugged in a variety of ways. For example, the circuit test may be repeatedly executed and debugged with respect to one component in a component group, and then associated with each component in its component group when it is believed to have been satisfactorily debugged (or associated with each component in its component group as it is being debugged). Alternatively, the circuit test may be executed with respect to all of the components in a component group, and then debugged with respect to different components in the component group. Preferably, a circuit test which is common to a component group is first executed and debugged with respect to one component in the component group, and then executed and debugged with respect to all of the components in the component group.

A preferred method of debugging a circuit test is illustrated in FIG. 3. The method begins with the choosing 300 of a component group, and the choosing 300 of a component within the component group. Next, the circuit test which is associated with the chosen component is executed 302 with respect to the chosen component one or more times. If test results indicate that the component has failed the test, the test and the test results must then be analyzed to determine if the component should have failed the test, or if the component only failed the test as a result of some test misadjustment (i.e., a faulty test and/or too stringent of a test). If it is determined 304 that the component only failed the test as a result of a test misadjustment, the circuit test is not yet stabile 304, and the component's failure may be designated a "false fail". The circuit test which caused the false fail will then need to be debugged 306. After the component's test has been adjusted 306, the test needs to be executed 302 with respect to the component again. As long as execution 302 of the test continues to generate false fails, the test may be deemed unstable 304 and the steps of this paragraph will need to be repeated.

At some point, the circuit test which is associated with the chosen component will be deemed satisfactory. At this point, it must be assured that the circuit test is associated 308 with all of the components in the chosen component's component group. Thereafter, the test may be executed 310 one or more times with respect to all of the components in the component group. Although the test was already debugged 306 with respect to one component in the component group, component manufacturing tolerances almost guarantee that no two components will have exactly the same value, load, etc. As a result, it is likely that a test which has been debugged 306 with respect to one component in a component group will still generate false fails with respect to other components in the component group (i.e., the test may still be unstable 312).

As these false fails are generated, a test which is associated with a falsely failed component may be further debugged 314, with each component in the falsely failed component's component group once again being updated 316 with the debugged test.

While the debug of a circuit test with respect to a falsely failed component is a form of reactive debugging, the association of a debugged circuit test with each component in the falsely failed component's component group is a form of proactive debugging. Heretofore, debugging efforts have primarily relied on reactive debugging. However, proactive debugging significantly reduces the time it takes to debug all of the tests which are applied to a given circuit.

The reduction in debug time which is achieved using the method illustrated in FIGS. 1–3 can be approximated by the following equation:

$$(C-G)/C,$$

where C=total number of components in a circuit, and
G=total number of component groups in a circuit
Consider Circuit Board A, which was discussed in the Summary of the Invention which preceded this Detailed Description:

Board A = 1,000 analog components
100 component groups

The method illustrated in FIGS. 1–3 reduces the debug time for Board A by 90% ((1,000–100)/1,000=90%). If it previously took 2 days for development and initial debug of circuit tests for Board A, and 4 weeks for additional debug and test stabilization, the method illustrated in FIGS. 1–3 reduces the debug time for development and initial debug of circuit tests for Board A to less than ½ day, and reduces the time it takes the tests to stabilize to less than 3 days. Given that this is such a substantial decrease in debug time, an in-circuit test (ICT) programmer may now focus more time on developing quality tests, while still saving time in his or her overall debug effort.

In a preferred embodiment of the method illustrated in FIGS. 1–3, a test history log is maintained. Each time a circuit test is modified, the test history log is updated 110, 318. In this manner, a test history log for a particular component group can be accessed (or generated) during a debug effort to insure that a modified test has not been previously tried and abandoned. Note that accessing a test history log for a component group provides access to not only previously tried and abandoned circuit tests for a particular component, but access to previously tried and abandoned circuit tests for all of the components in the particular component's component group. As a result, an ICT programmer can review previously tried and abandoned circuit tests for all of the components in a component group, and avoid using the previously tried and abandoned circuit tests with respect to any of the components in the component group. This leads to faster test stabilization.

A test history log may be maintained 110, 318 for each component group or for each component. Alternatively, each tried and abandoned test may be recorded in a mass log. In the latter cases, a list of the components in a particular component group can be used to dynamically compile a test history log for the particular component group. Preferably, a test history log is maintained for each component group, but each entry in the test history log comprises information which indicates which particular component led to abandonment of the previously tried test entry.

Figure 4:
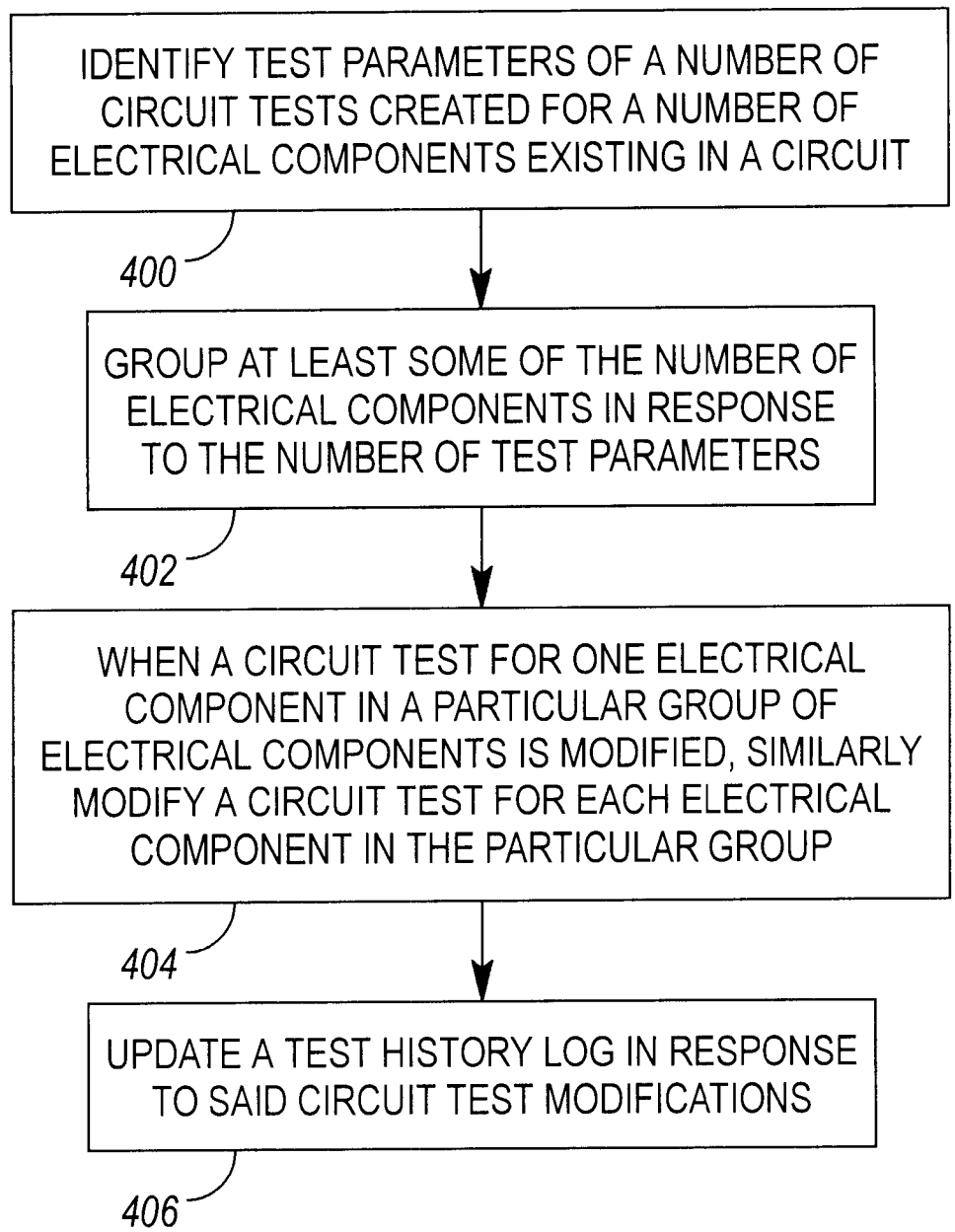
FIG. 4 illustrates a second preferred method of managing circuit tests.
Figure 5:
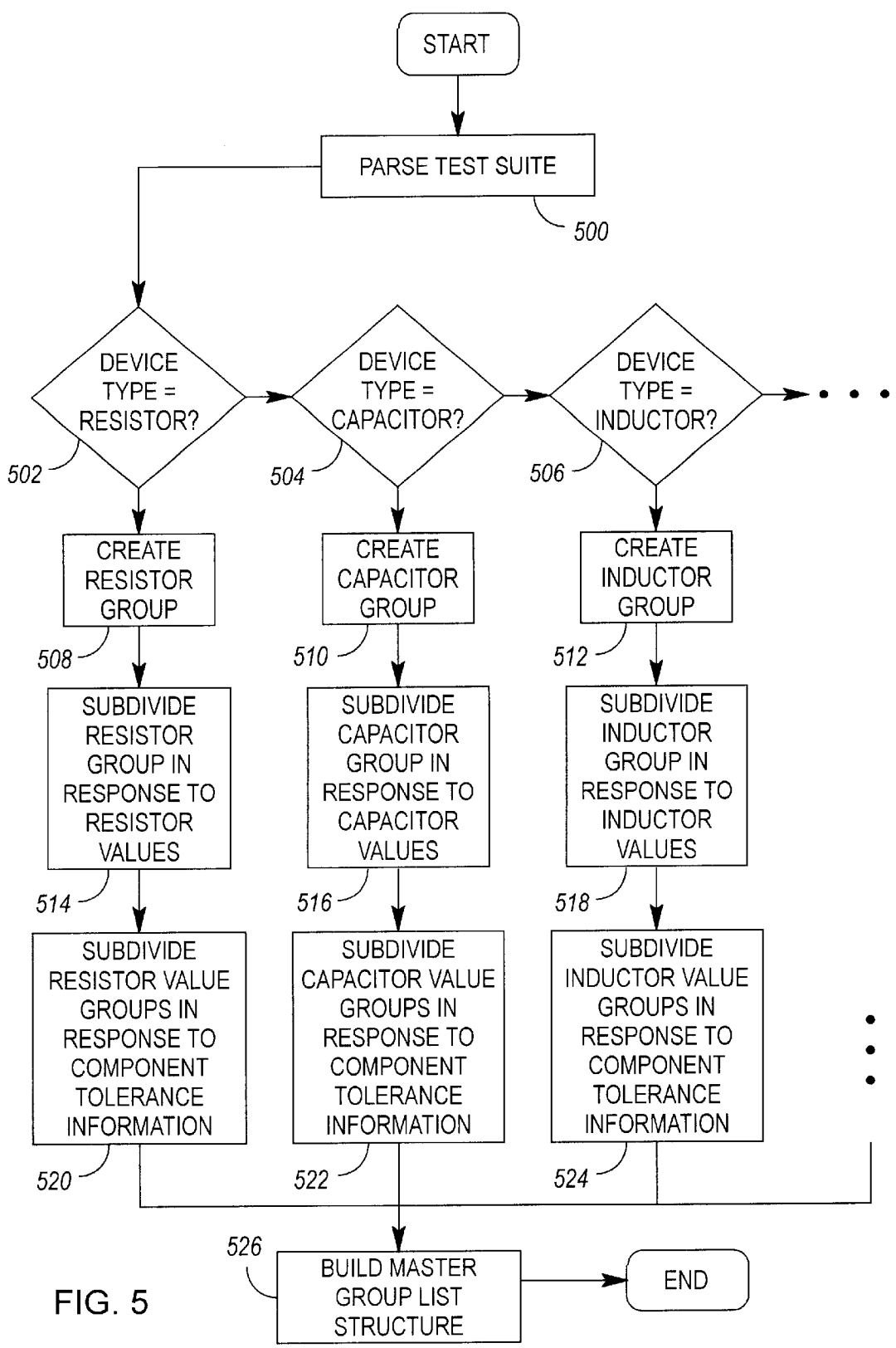
FIG. 5 illustrates a method of forming the electrical component groups which are required by the FIG. 4 method.

An alternative method of managing circuit tests is illustrated in FIGS. 4, 5 & 3. This alternative method is similar to that disclosed in FIGS. 1–3. However, it begins with the identification 400 (FIG. 4) of a number of test parameters of a number of circuit tests which were created for a number of electrical components which exist in a circuit. The alternative method illustrated in FIGS. 4, 5 & 3 may be used, for example, when one does not have access to a mathematical model of a circuit.

The test parameters of a number of circuit tests may be identified 400 in a variety of ways. One way to perform such an identification is by parsing 500 (FIG. 5) a computer file which holds a test suite for a circuit.

The test parameters which are identified 400 for the components of a circuit may comprise parameters such as: component type information, component value information, and component tolerance information. Component tolerance information may comprise information such as value tolerance information, frequency response tolerance information, and so on. Note that some test parameters may in fact comprise information which identifies a component's electrical characteristics.

After test parameters for a number of circuit tests have been identified 400, at least some of the electrical components which are being subjected to the circuit tests are grouped 402 in response to the test parameters of their associated circuit tests. Preferably, all of the electrical components are sorted into groups. However, as will be discussed later in this description, there may be reasons for not grouping 402 some of the electrical components.

FIG. 5 illustrates an exemplary method for performing such a grouping 402. First, the electrical components are grouped by type (e.g., a group of resistors 502, 508, a group of capacitors 504, 510, a group of inductors 506, 512, and a group or groups of other components). Thereafter, the component groups are divided into smaller groups based on component values 514, 516, 518 and component tolerance information 520, 522, 524. Preferably, groups of components are formed in response to identity of test parameters found in their circuit tests. Alternatively, groups of components may be formed in response to ranges of test parameters.

When grouping 402 is complete, a master group list structure comprising a list of all of the components in each group may be compiled 526.

Formation of component groups based on ranges of test parameters might be particularly advantageous when a test suite is received for the purpose of grouping 402 electrical components in the middle of a debug effort. If a test suite is initially generated with the assistance of a computer, it is likely, for example, that the same circuit test will initially be generated for most if not all 10 kΩ resistors which have the same topological connections within a circuit. However, the tests which are generated for these resistors may not be ideal, and some of the resistors will likely generate "false fails". Furthermore, manufacturing variances in the resistors will typically lead to the resistors falsely failing at different times. As a result, their associated tests are likely to be debugged at different times, and quite possibly, by different people. The tests for the theoretically identical 10 kΩ resistors are therefore likely to diverge. In such a case, it might desirable to assume that circuit tests having parameters falling into predefined ranges are actually associated with the same electrical component, and that the parameters of the tests merely differ due to nonuniform test solutions being applied to components which have falsely failed at different times.

After components have been grouped 402, the FIG. 4 method continues by ensuring that each time a circuit test for one electrical component in a particular component group is modified, the circuit test for each component in the particular group is similarly modified 404—thus ensuring the uniformity of circuit tests which are applied to the components in a particular component group. If desired, a test history log may be maintained 406.

An exemplary portion of a test suite 600 on which the method illustrated in FIGS. 4, 5 & 3 might operate is illustrated in FIG. 6. Note that the test suite 600 comprises a list of circuit components, with each component 602 being followed by a circuit test 604 which is designed to exercise the component 602 to determine whether it will fully function for its intended purpose.

The entirety of the FIG. 6 test suite 600 might comprise numerous types of components associated with numerous different tests. However, the portion of the test suite 600 which is illustrated in FIG. 6 illustrates various parameters for three different types of circuit test: a resistor test (FIG. 7C), a capacitor test (FIG. 7A), and an inductor test (FIG. 7B). The resistor test which is illustrated in FIG. 7C comprises the following parameters, some or all of which might be used in grouping the components identified in the FIG. 6 test suite 600: a component type 732, a component value 734, a percent high tolerance value 736, a percent low tolerance value 738, an indication of how to set a tester's probe resistance 740, an indication to set a tester to wide band mode for noisy circuits 742, and an indication of how to set a tester's amperage delivery 744. The capacitor test which is illustrated in FIG. 7A comprises the following parameters: a component type 700, a component value 702, a percent high tolerance value 704, a percent low tolerance value 706, an indication of how to set a tester's measurement frequency 708, an indication of how to set a tester's probe resistance 710, an indication of how to set a tester's amperage delivery 712, an indication to read an extra digit during testing 714, and an indication that no capacitance compensation is required during testing 716. The inductor test which is illustrated in FIG. 7B comprises the following parameters: a component type 718, a component value 720, a percent high tolerance value 722, a percent low tolerance value 724, an indication of how to set a tester's measurement frequency 726, an indication of how to set a tester's probe resistance 728, and an indication of how to set a tester's amperage delivery 730. The tests which are illustrated in FIGS. 6–9 are tests which could, for example, be executed on the HP3070 tester which is produced by Agilent Technologies of Santa Clara, Calif.

If the FIG. 6 test suite is parsed using the method disclosed in FIGS. 4, 5 & 3, the component groups 800, 802, 804 illustrated in FIG. 8 might result. Note that identity of test parameters forms the "key" by which electrical components are grouped. Also note that the component groups 800–804 illustrated in FIG. 8 not only list the components for which tests are disclosed in FIG. 6, but other components which are presumed to match the "keys" of the various component groups 800–804.

It has been mentioned on a couple of occasions that there may be reasons for not grouping some of the electrical components in a circuit. These reasons will now be discussed.

One reason for not grouping components is that an ICT programmer might know that certain components are "unique", or that certain components are likely to behave differently even though they would theoretically appear to be identical to other components in a circuit. For example, many digital components (such as signal processors, control elements, etc.) are unique to a circuit and therefore require a unique test solution. Other components may appear more than once in a circuit, but may be configured in different ways (for example, it is common to use only part of the functionality of an off-the-shelf integrated circuit (IC), and one portion of an IC's functionality may be used in conjunction with one instance of the IC, and another portion of the IC's functionality may be used in conjunction with another instance of the IC—thus requiring two different test solutions for the same component). It is also possible that two theoretically identical analog components might need to be subjected to different test solutions. For example, one component might be mounted in a central portion of a circuit board, while another presumably identical component might be mounted near an edge of a circuit board. An ICT programmer might have knowledge that a manufacturing process will more often lead to damage of the component nearer to the circuit board's edge. As a result, it might be desirable to exclude the component which is nearer to the circuit board's edge from a component group, and provide a test solution for the component which is specifically tailored to its testing needs.

The methods which are disclosed herein are preferably implemented in software, firmware or the like. Given the above description, one skilled in the art of programming should be readily able to generate the appropriate software which is needed for a given application of a particular method.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method of managing circuit tests, comprising:
   a) identifying a number of electrical characteristics of a number of electrical components existing in a circuit;
   b) grouping at least some of the number of electrical components in response to the number of electrical characteristics; and
   c) for each group of electrical components formed, establishing a circuit test which is common to the electrical components of the group.

2. A method as in claim 1, wherein said identifying comprises parsing a mathematical model of the circuit.

3. A method as in claim 1, wherein the number of electrical characteristics comprises component type information.

4. A method as in claim 1, wherein the number of electrical characteristics comprises component value information.

5. A method as in claim 1, wherein the number of electrical characteristics comprises circuit topology information.

6. A method as in claim 1, wherein said grouping is performed in response to identity of one or more of the number of electrical characteristics.

7. A method as in claim 1, wherein said grouping is performed in response to ranges of one or more of the number of electrical characteristics.

8. A method as in claim 1, further comprising, when a circuit test which is associated with one electrical component in a particular group of electrical components is modified, similarly modifying circuit tests which are associated with each other electrical component in the particular group of electrical components.

9. A method as in claim 8:
   a) further comprising, after modification of the circuit test which is associated with the one electrical component in the particular group of electrical components, executing the circuit test which is associated with the one electrical component with respect to the one electrical component; and
   b) wherein similar modification of circuit tests which are associated with each other electrical component in the particular group of electrical components is only performed after the circuit test which is associated with the one electrical component is deemed to execute satisfactorily with respect to the one electrical component.

10. A method as in claim 8:
    a) further comprising, after modification of the circuit test which is associated with the one electrical component in the particular group of electrical components, executing the circuit test which is associated with the one electrical component with respect to each electrical component in the particular group of electrical components; and
    b) wherein similar modification of circuit tests which are associated with each other electrical component in the particular group of electrical components is only performed after the circuit test which is associated with the one electrical component is deemed to execute satisfactorily with respect to each electrical component in the particular group of electrical components.

11. A method as in claim 1, further comprising:
    a) for each group of electrical components, maintaining a list of electrical components which are included in the group; and
    b) when a circuit test which is associated with one electrical component in a particular group of electrical components is modified, using the list of electrical components which are included in the particular group as an index into a data structure which maintains circuit tests for the number of electrical components.

12. A method as in claim 1, further comprising:
    a) maintaining a test history log; and
    b) updating the test history log as circuit tests are modified.

13. Apparatus for managing circuit tests, comprising:
    a) a number of computer readable media; and
    b) computer readable program code stored on said number of computer readable media, said computer readable program code comprising:
       i) program code for identifying a number of electrical characteristics of a number of electrical components existing in a circuit;
       ii) program code for grouping at least some of the number of electrical components in response to the number of electrical characteristics; and
       iii) program code which, for each group of electrical components, establishes a circuit test which is common to the electrical components of the group.

14. A method of managing circuit tests, comprising:
    a) identifying a number of test parameters of a number of circuit tests created for a number of electrical components existing in a circuit;
    b) grouping at least some of the number of electrical components in response to the number of test parameters; and c) when a circuit test which is associated with one electrical component in a particular group of electrical components is modified, similarly modifying circuit tests which are associated with each other electrical component in the particular group of electrical components.

15. A method as in claim 14, wherein the number of test parameters comprises component type information.

16. A method as in claim 15, wherein the number of test parameters comprises component tolerance information.

17. A method as in claim 16, wherein the component tolerance information comprises value tolerance information.

18. A method as in claim 16, wherein the component tolerance information comprises frequency response tolerance information.

19. A method as in claim 14, wherein the number of test parameters comprises component value information.

20. A method as in claim 14, wherein said grouping is performed in response to identity of one or more of the number of test parameters.

21. A method as in claim 14, wherein said grouping is performed in response to ranges of one or more of the number of test parameters.

22. A method as in claim 14:
a) further comprising, after modification of the circuit test which is associated with the one electrical component in the particular group of electrical components, executing the circuit test which is associated with the one electrical component with respect to the one electrical component; and
b) wherein similar modification of circuit tests which are associated with each other electrical component in the particular group of electrical components is only performed after the circuit test which is associated with the one electrical component is deemed to execute satisfactorily with respect to the one electrical component.

23. A method as in claim 14:
a) further comprising, after modification of the circuit test which is associated with the one electrical component in the particular group of electrical components, executing the circuit test which is associated with the one electrical component with respect to each electrical component in the particular group of electrical components; and
b) wherein similar modification of circuit tests which are associated with each other electrical component in the particular group of electrical components is only performed after the circuit test which is associated with the one electrical component is deemed to execute satisfactorily with respect to each electrical component in the particular group of electrical components.

24. A method as in claim 14, further comprising:
a) for each group of electrical components, maintaining a list of electrical components which are included in the group; and
b) when a circuit test which is associated with one electrical component in a particular group of electrical components is modified, using the list of electrical components which are included in the particular group as an index into a data structure which maintains circuit tests for the number of electrical components.

25. A method as in claim 14, further comprising:
a) maintaining a test history log; and
b) updating the test history log as circuit tests are modified.

26. Apparatus for managing circuit tests, comprising:
a) a number of computer readable media; and
b) computer readable program code stored on said number of computer readable media, said computer readable program code comprising:
i) program code for identifying a number of test parameters of a number of circuit tests created for a number of electrical components existing in a circuit;
ii) program code for grouping at least some of the number of electrical components in response to the number of test parameters; and
iii) program code for similarly modifying circuit tests which are associated with each electrical component in a particular group of electrical components when a circuit test which is associated with one electrical component in the particular group of electrical components is modified.

* * * * *